(12) United States Patent
Ganfield et al.

(10) Patent No.: US 10,324,491 B2
(45) Date of Patent: Jun. 18, 2019

(54) REDUCING TIME OF DAY LATENCY VARIATION IN A MULTI-PROCESSOR SYSTEM

(71) Applicant: International Business Machines Corporation, Armonk, NY (US)

(72) Inventors: Paul A. Ganfield, Rochester, MN (US); David J. Krolak, Rochester, MN (US); Luis A. Lastras-Montano, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 280 days.

(21) Appl. No.: 15/433,214

(22) Filed: Feb. 15, 2017

(65) Prior Publication Data

US 2018/0232006 A1 Aug. 16, 2018

(51) Int. Cl.
*G06F 1/14* (2006.01)
*H04L 7/00* (2006.01)
*H03M 13/09* (2006.01)

(52) U.S. Cl.
CPC .............. *G06F 1/14* (2013.01); *H04L 7/0037* (2013.01); *H04L 7/0075* (2013.01); *H03M 13/09* (2013.01)

(58) Field of Classification Search
None
See application file for complete search history.

(56) References Cited

U.S. PATENT DOCUMENTS

| 5,511,224 A | 4/1996 | Tran et al. |
| 5,519,883 A | 5/1996 | White et al. |
| 7,143,226 B2 | 11/2006 | Fields, Jr. et al. |
| 7,697,435 B1* | 4/2010 | Sill .................. H04L 43/0852 370/235 |
| 7,865,758 B2 | 1/2011 | Swaney et al. |

(Continued)

FOREIGN PATENT DOCUMENTS

WO WO2008135305 A1 11/2008

OTHER PUBLICATIONS

Effenberger et al., "Time of day Distribution over E-PON", Huawei Technologies Co., Ltd, Mar. 2009.

(Continued)

*Primary Examiner* — Kim Huynh
*Assistant Examiner* — Danny Chan
(74) *Attorney, Agent, or Firm* — Martin & Associates, LLC; Derek P. Martin

(57) ABSTRACT

A time of day (TOD) synchronization mechanism in a first processor transmits a latency measure message simultaneously on two links to a second processor. In response, the receiver in the second processor detects latency differential between the two links, detects the delay in the second processor, and sends the latency differential and delay to the first processor on one of the two links. The first processor stores TOD delay values in the two links that account for the latency differential between the two links. When a TOD message needs to be sent, a link loads a counter with its stored TOD delay value, then decrements the counter until the TOD message is ready to be sent. The resulting counter value is the receiver delay value, which is transmitted to the receiver as data in the TOD message, thereby reducing TOD jitter between the two links.

18 Claims, 8 Drawing Sheets

(56) References Cited

U.S. PATENT DOCUMENTS

| | | | |
|---|---|---|---|
| 2013/0208735 A1* | 8/2013 | Mizrahi | H04J 3/0661 370/503 |
| 2015/0334630 A1* | 11/2015 | McTernan | H04W 40/12 370/255 |
| 2017/0034843 A1* | 2/2017 | Liu | H04L 47/56 |

OTHER PUBLICATIONS

Broadcom, "Ethernet Time Synchronization", White Paper, 2008.
Tian et al., "High-Precision Relative Clock Synchronization Using Time Stamp Counters", 13th IEEE Int'l Conference on Engineering of Complex Computer Systems, pp. 69-78, 2008.

* cited by examiner

| Bits | 0 | 1 | 2 | 3:11 | 12:203 | 204:239 |
|---|---|---|---|---|---|---|
| | ACK | Link | Replay | Sequence Number | Data | CRC |

FIG. 3

| Service Packets ||
|---|---|
| Sequence Number | Type |
| 0x55 | TOD |
| 0xB0 | Latency Measure |

FIG. 4

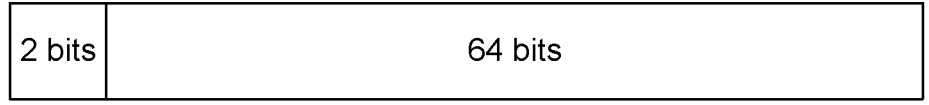
FIG. 5
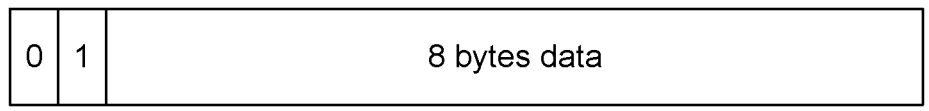
FIG. 6
FIG. 7
| 64/66 Control Blocks | |
|---|---|
| Value | Type |
| 0x78 | TOD |
| 0xB4 | Latency Measure |
FIG. 8

REDUCING TIME OF DAY LATENCY VARIATION IN A MULTI-PROCESSOR SYSTEM

BACKGROUND

1. Technical Field

This disclosure generally relates to computer systems, and more specifically relates to multi-processor systems.

2. Background Art

Multi-processor systems include multiple processors that are interconnected so the processors can work together. Symmetric multiprocessing is one type of multi-processor system that includes multiple processors that share a common operating system and memory. The Power8 processor developed by IBM is an example of a processor that supports symmetric multiprocessing.

For multiple processors to work together, the processors must have a common time reference. Time of day (TOD) messages are periodically sent between processors to keep the time of day clocks for all processors synchronized. The time of day messages need to be reliable and have low variation in latency, which is sometimes referred to as TOD jitter.

The Power8 processor developed by IBM includes an interconnect known as a fabric that is used to interconnect processors. The fabric interconnecting Power8 processors includes electrical links that provide Error Correction Code (ECC) capabilities that allow correcting errors in the messages. The Power8 processor architecture provides links that have small latency variation, or small TOD jitter.

The next generation of the Power family of processors will have electrical links that can perform a cyclic redundancy check (CRC) replay if bit errors exist in the message. A CRC replay will cause latency variation, or jitter, in the TOD. Without a way to reduce TOD jitter in a multi-processor system, the TOD jitter will be excessive.

BRIEF SUMMARY

A time of day (TOD) synchronization mechanism in a first processor transmits a latency measure message simultaneously on two links to a second processor. In response, the receiver in the second processor detects latency differential between the two links, detects the delay in the second processor, and sends the latency differential and delay to the first processor on one of the two links. The first processor stores TOD delay values in the two links that account for the latency differential between the two links. When a TOD message needs to be sent, a link loads a counter with its stored TOD delay value, then decrements the counter until the TOD message is ready to be sent. The resulting counter value is the receiver delay value, which is transmitted to the receiver as data in the TOD message. Because the link delay values account for the latency differential between the two links, the TOD jitter between the two links is reduced.

The foregoing and other features and advantages will be apparent from the following more particular description, as illustrated in the accompanying drawings.

BRIEF DESCRIPTION OF THE SEVERAL VIEWS OF THE DRAWING(S)

The disclosure will be described in conjunction with the appended drawings, where like designations denote like elements, and:

FIG. 3 is a block diagram showing a sample format of a serial data packet that could be sent between processors in FIG. 1;

FIG. 4 is a table showing examples of service packets that could be sent between processors in FIG. 1 in the format shown in FIG. 3;

FIG. 5 is a block diagram showing a 64/66 encoded message;

FIG. 6 is a block diagram of a data block for the 64/66 encoded message shown in FIG. 5;

FIG. 7 is a block diagram of a control block for the 64/66 encoded message shown in FIG. 5;

FIG. 8 is a table showing examples of 64/66 control blocks that could be sent between processors in FIG. 1;

DETAILED DESCRIPTION

A time of day (TOD) synchronization mechanism in a first processor transmits a latency measure message simultaneously on two links to a second processor. In response, the receiver in the second processor detects latency differential between the two links, detects the delay in the second processor, and sends the latency differential and delay to the first processor on one of the two links. The first processor stores TOD delay values in the two links that account for the latency differential between the two links. When a TOD message needs to be sent, a link loads a counter with its stored TOD delay value, then decrements the counter until the TOD message is ready to be sent. The resulting counter value is the receiver delay value, which is transmitted to the receiver as data in the TOD message. Because the link delay values account for the latency differential between the two links, the TOD jitter between the two links is reduced.

Figure 1:
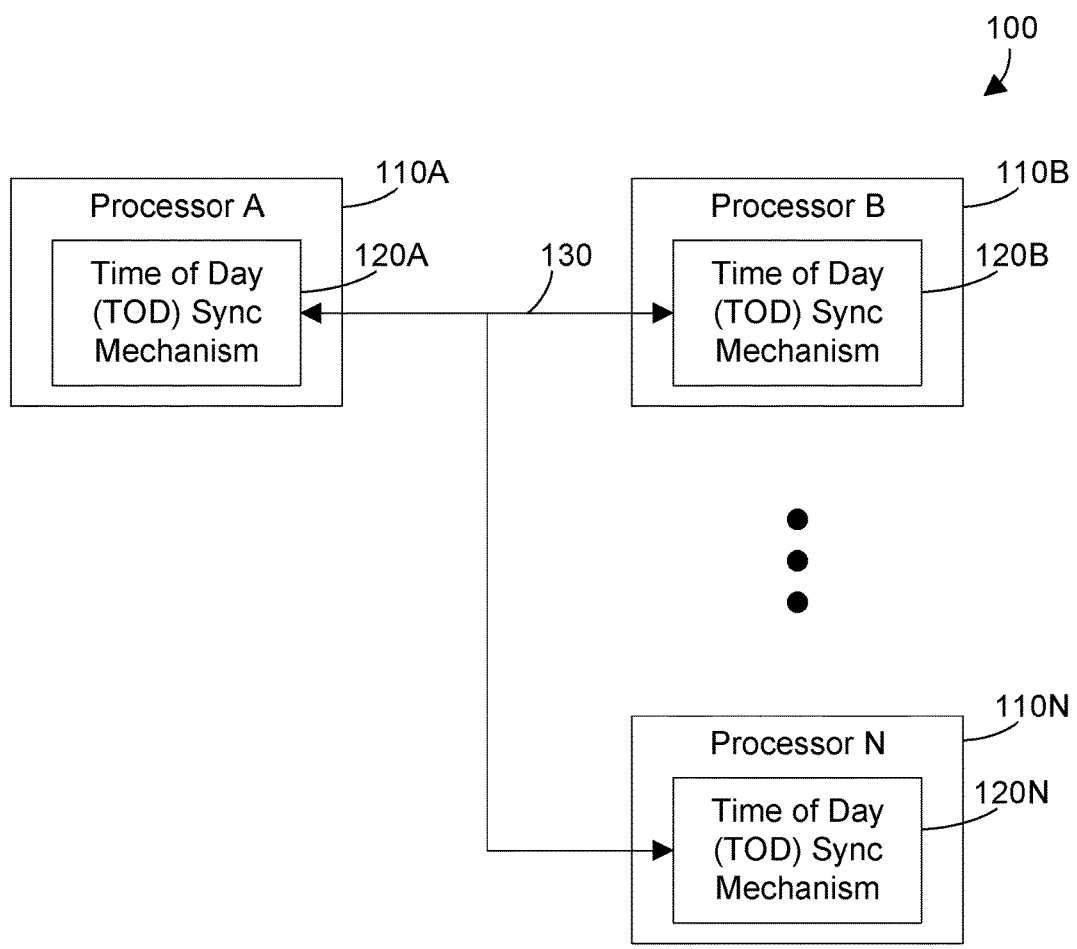
FIG. 1 is a block diagram showing multiple processors interconnected in a multiprocessing system.

Referring to FIG. 1, a multi-processor system 100 includes multiple processors 110A, 110B, . . . 110N interconnected with a communication fabric 130. Each processor includes a time of day (TOD) synchronization mechanism. Thus, processor A 110A includes a TOD synchronization mechanism 120A; processor B 110B includes a TOD synchronization mechanism 120B, through processor N 110N, which includes a TOD synchronization mechanism 120N. The TOD synchronization mechanisms synchronize the time of day between processors. The communication fabric 130 can include multiple different communication channels. In the most preferred implementation, communication fabric 130 includes electrical links that communicate in one particular way, and optical links that communicate in a different way. The Power9 processor developed by IBM has electrical links and optical links in the communication fabric that interconnect processors. Note the optical links in the Power9 processor architecture do not actually process optical signals, but are electrical interfaces that process electrical signals. The terms "electrical links" and "optical links" are well-known in Power9 terminology, and are used herein to distinguish between two distinct electronic interfaces in the communication fabric 130 between processors that use different communication protocols without implying these interfaces have the same characteristics, properties or protocols as the Power9 processor architecture.

The communication fabric 130 preferably includes multiple bit lanes organized by protocol layer. The electrical links preferably define fifteen lanes, plus one spare lane. A packet on the electrical link is 30 bytes. The optical links preferably define ten bytes that correspond to ten lanes, plus two spare lanes.

Figure 2:
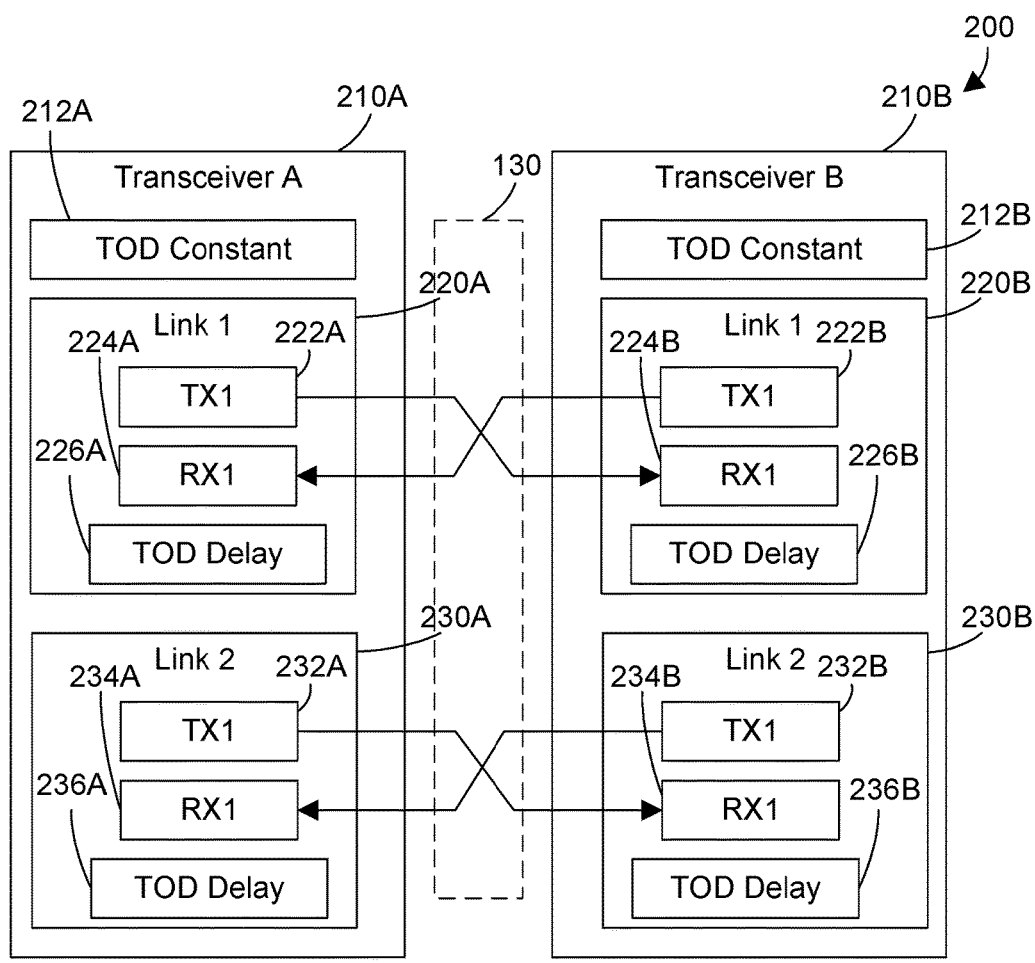
FIG. 2 is a block diagram showing transceivers on the processors in FIG. 1 that allow the processors to communicate with each other.

FIG. 2 shows transceivers 200 that illustrate part of the communication fabric 130. For this particular example, we assume Transceiver A 210A is in processor A 110A shown in FIG. 1, and Transceiver B 210B is in processor B 110B in FIG. 1. FIG. 2 thus shows links that interconnect processors 110A and 110B in FIG. 1 via the communication fabric 130. Transceiver A 210A includes a first link 220A with a corresponding transmitter 222A and receiver 224A, and a second link 230A with a corresponding transmitter 232A and receiver 234A. Transceiver B 210B has a similar configuration, with a first link 220B that includes a transmitter 222B and a corresponding receiver 224B, and a second link 230B that includes a transmitter 232B and a corresponding receiver 234B. The transmitters and receivers are interconnected via the communication fabric 130 so transmitters are connected to receivers and receivers are connected to transmitters, as shown in FIG. 2.

Each transceiver 210A and 210B includes a corresponding TOD constant 212A and 212B. The TOD constants 212A and 212B are determined as explained below with reference to FIG. 9. Each link has a corresponding TOD delay that is determined by a latency measure interaction with the other transceiver, as described in more detail below with respect to FIG. 9. Thus, link 1 220A in Transceiver A 210A includes a TOD delay register 226A; link 1 220B in Transceiver B 210B includes a TOD delay register 226B; link 2 230A in Transceiver A 210A includes a TOD delay register 236A; and link 2 230B in Transceiver B 210B includes a TOD delay 236B register. The value stored in the TOD delay register for a link is used to derive a value for a receiver delay value transmitted in each TOD packet or TOD control block transmitted on that link.

In one specific implementation, the communication fabric 130 may include both electrical links and optical links. Transceivers 200 shown in FIG. 2 are representative of both the electrical links and the optical links.

Referring to FIG. 3, a sample packet format for a serial packet is shown. The serial packet shown in FIG. 3 could define packets, for example, that are used to communicate on the electrical links between processors. The sample packet format in FIG. 3 includes an ACK bit at bit 0, followed by a link bit at bit 1 that provides the logical link number, followed by a replay bit at bit 2 that indicates when a packet contains delayed data due to a replay, a nine bit sequence number at bits 3-11, followed by 192 bits (24 bytes) for data at bits 12-203, and 36 bits at bits 204-239 for a cyclic redundancy check (CRC). The sequence number in bits 3 through 11 can include coding that specifies types of service packets. In one particular implementation, when bits 3-11 are all ones, this indicates a service packet, and the first byte of data indicates the type of service packet. Referring to FIG. 4, two suitable types of service packets include a time of day (TOD) packet and a latency measure packet. Other service packets not shown in FIG. 4 could also be defined, as needed. A packet is a TOD packet when the sequence number in bits 3-11 is all ones and the first byte of the data field has a value of 0x55. A packet is a latency measure packet when the sequence number in bits 3-11 is all ones and the first byte of the data field has a value of 0xB0.

Referring to FIGS. 5-7, a sample packet format for a serial block is shown. Such blocks could be used, for example, to communicate on the optical links between processors. The serial block shown in FIGS. 5-7 are in 64/66 encoding, where the first two bits distinguish between data block and control blocks. Data blocks have a value of 01 in the first two bits, as shown in FIG. 6, followed by 64 bits (8 bytes) of data. Control blocks have a value of 10 in the first two bits, as shown in FIG. 7, followed by an eight bit field that specifies the type of control block, and 56 bits (7 bytes) that can be empty or can contain any suitable control information, data, or any suitable mixture of the two. Two types of control blocks that are used for TOD operations are shown in FIG. 8 to include a TOD control block and a latency measure control block. A control block is a TOD control block when the value 0x78 is in the type field shown in FIG. 7. Similarly, a control block is a latency measure control block when the value 0xB4 is in the type field shown in FIG. 7.

Figure 9:
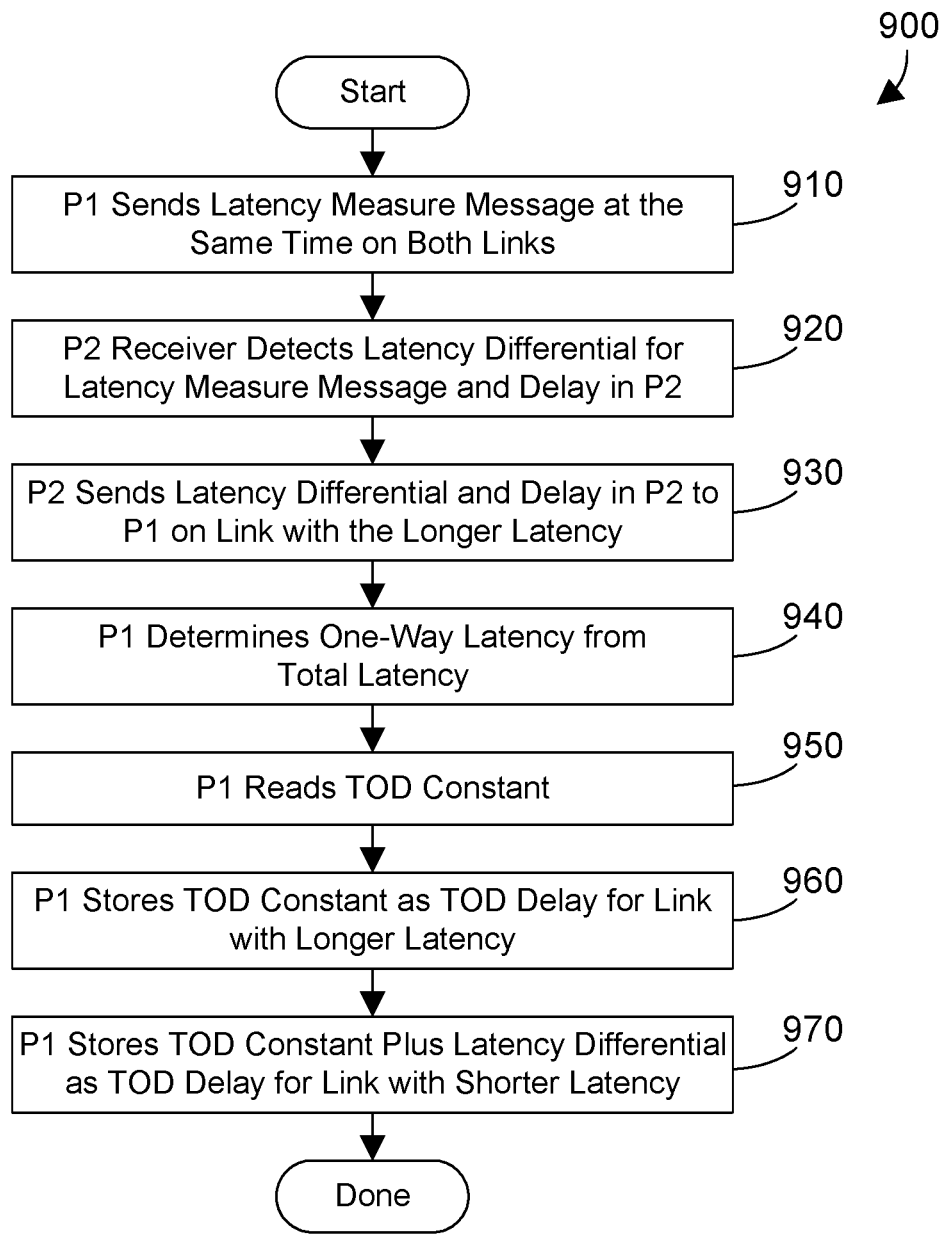
FIG. 9 is a flow diagram of a method for determining TOD delay for each of the two links shown in FIG. 2.

Referring to FIG. 9, a method 900 shows how a processor may determine an TOD delay values for each link to keep TOD between processors in sync. This example assumes two processors P1 and P2 are interconnected. Method 900 is preferably performed by the TOD synchronization mechanisms (see FIG. 1) in the respective processors P1 and P2. P1 sends a latency measure packet (for an electrical link) or control block (for an optical link) on both links (step 910). For the discussion of method 900 in FIG. 9, we use the term "latency measure message" as a general term that includes a latency measure packet if the communication takes place on electrical links, and that includes a latency measure control block if the communication takes place on optical links. Assuming Transceiver A 210A in FIG. 2 corresponds to P1 in FIG. 1 and Transceiver B 210B in FIG. 2 corresponds to P2 in FIG. 1, Transceiver A 210A sends the same latency measure packet or control block on both transmitters 222A and 232A in the two links 220A and 230A. The P2 receiver detects any latency differential between the two links, and also keeps a count of the delay in P2 for processing the latency measure packet or control block (step 920). P2 then sends the latency differential and delay in P2 to P1 on the link that had the longer latency in sending the original message (step 930). Note the selection of the link that had the longer latency is a simple design choice, and the link that had the shorter latency could likewise be used. Again referring to FIG. 2, if the latency measure packet or control block was received first in the receiver 224B in link 1 220B, then was received in the second receiver 234B in link 2 230B, this means P2 will send the latency differential and delay in P2 via the transmitter 232B in link 2 230B. Note the latency differential and delay in P2 can be included in the data portion of a latency measure packet as shown in FIG. 3, and in the 56 bits of control or data in the control block shown in FIG. 7.

When P1 receives the message from P2 with the latency differential between links and the delay in P2, P1 determines the one-way latency from the total latency (step 940). For example, the one-way latency could be computed by taking the total latency, subtracting the delay in P2, and dividing by two. P1 then reads a TOD constant (step 950). The TOD constant is preferably large enough to cover the worst case delay in sending the TOD message. In the most preferred implementation, the TOD constant is a hard-coded value.

The TOD constant is then stored as the TOD delay for the link with the longer latency (step 960). The TOD constant is added to the latency differential between links and the resulting value is stored as the TOD delay for the link with the shorter latency (step 970). The TOD delay values thus have different values that account for the different latencies of the transmitters in the links, which results in the receiver receiving the same receiver delay value in TOD packets/control blocks regardless of which link is used to send the TOD packets/control blocks.

Figure 10:
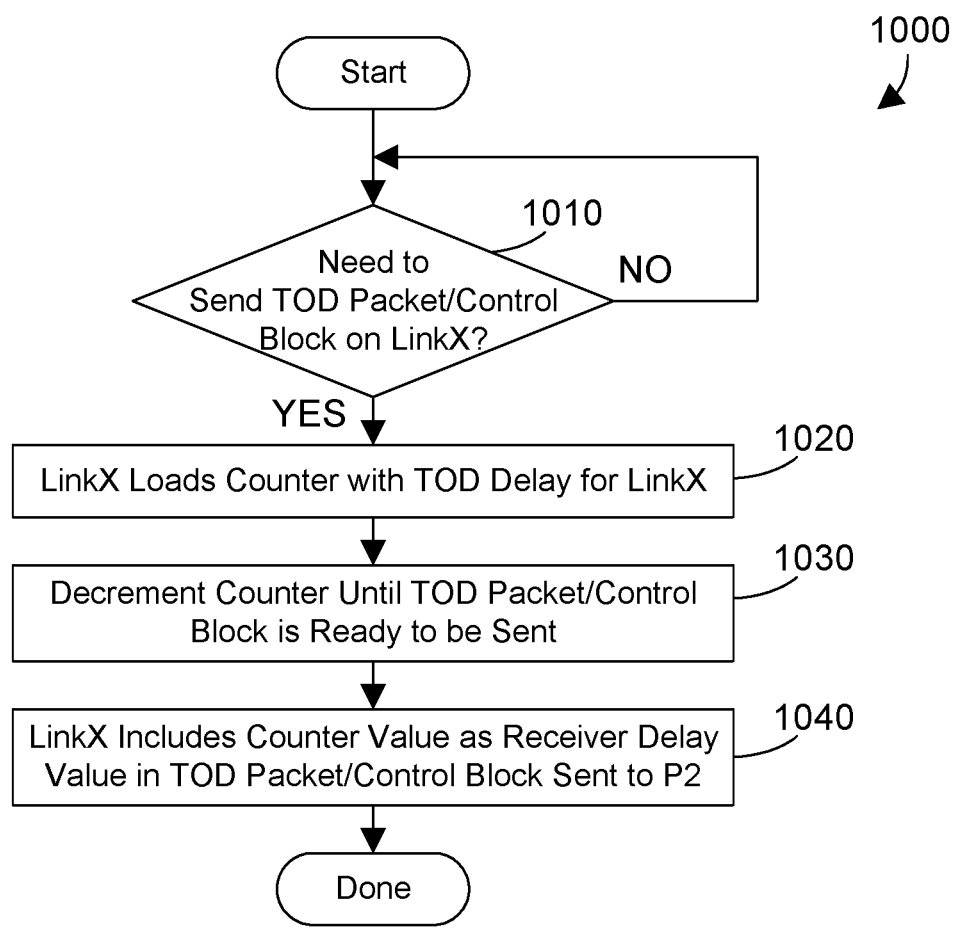
FIG. 10 is a flow diagram of a method for sending a value for a number of cycles of the receiver should delay TOD packets to reduce TOD jitter.

Method 1000 in FIG. 10 shows how a link uses its corresponding stored TOD delay value. Method 1000 determines when a TOD packet or control block needs to be sent on a link (step 1010). Note that method 1000 applies to both links, so the terminology LinkX is used to denote that one of the two links has been selected. When no TOD packet or control block needs to be sent (step 1010=NO), method 1000 loops back to step 1010 until a TOD packet or control block needs to be sent (step 1010=YES). For this example, we assume Link 1 needs to send a TOD packet or control block (step 1010=YES) Link 1 then loads a counter with the value stored in its corresponding TOD delay (step 1020). Thus, referring to FIG. 2, Link 1 reads the value from the TOD Delay register 226A and loads a counter with that value. The counter is decremented until the TOD packet or control block is ready to be sent (step 1030). The value of the counter is then included in the TOD packet or control block sent to P2 as the receiver delay value (step 1040). In one suitable implementation, the receiver delay value is a seven bit value. Note the difference in the values of the stored TOD delays is preferably the same as the latency differential detected in step 920 and sent to P1 in step 930 in FIG. 9. Thus, if the differential between Link 1 and Link 2 is two cycles, the longer link will have one value stored as its TOD delay, and the shorter link will have the one value plus two stored as its TOD delay. The result is that the receiver should receive packets or control blocks that have a consistent receiver delay value regardless of which link was used to send the TOD packet or control block. By including the receiver delay value in all TOD packets/control blocks between P1 and P2, the latency variation, or jitter, in the TOD is reduced.

Figure 11:
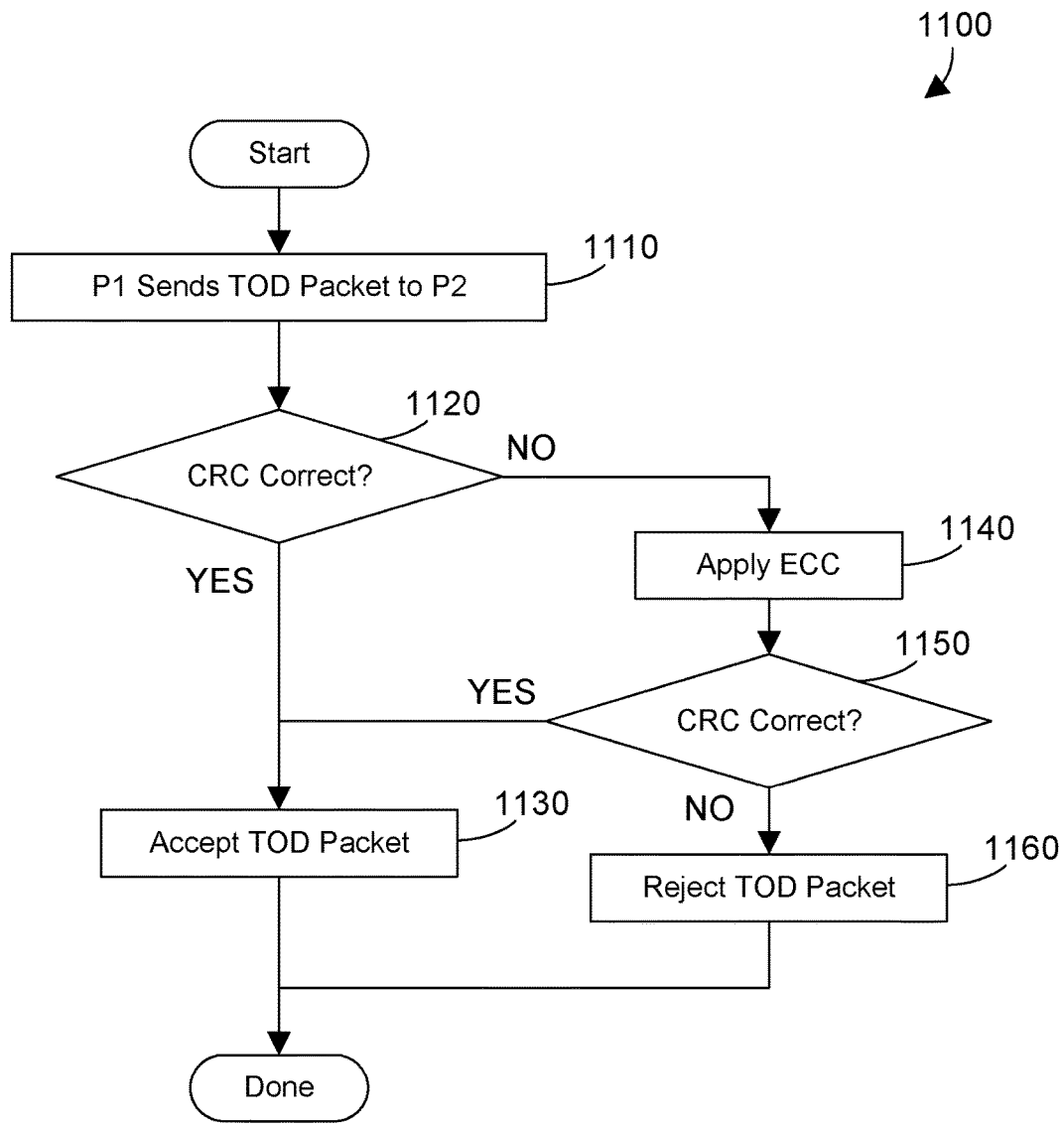
FIG. 11 is a flow diagram of a method for electrical links between processors to process TOD packets.

Referring to FIG. 11, a method 1100 shows how to process TOD packets. Method 1100 could apply, for example, to the electrical links in the communication fabric 130. P1 sends a TOD packet to P2 (step 1110). The data in the TOD packet includes the receiver delay value discussed above with reference to step 1040 in FIG. 10. As shown in FIG. 3, a TOD packet includes a CRC. When the CRC is correct (step 1120=YES), the TOD packet is accepted and processed (step 1130). When the CRC is not correct (step 1120=NO), error correction codes (ECC) are applied (step 1140) in an attempt to correct errors in the TOD packet. When the CRC is correct after applying the ECC (step 1150=YES), the TOD packet is accepted and processed (step 1130). When the CRC is still incorrect after applying the ECC (step 1150=NO), the TOD packet is rejected (step 1160). Method 1100 is then done.

Figure 12:
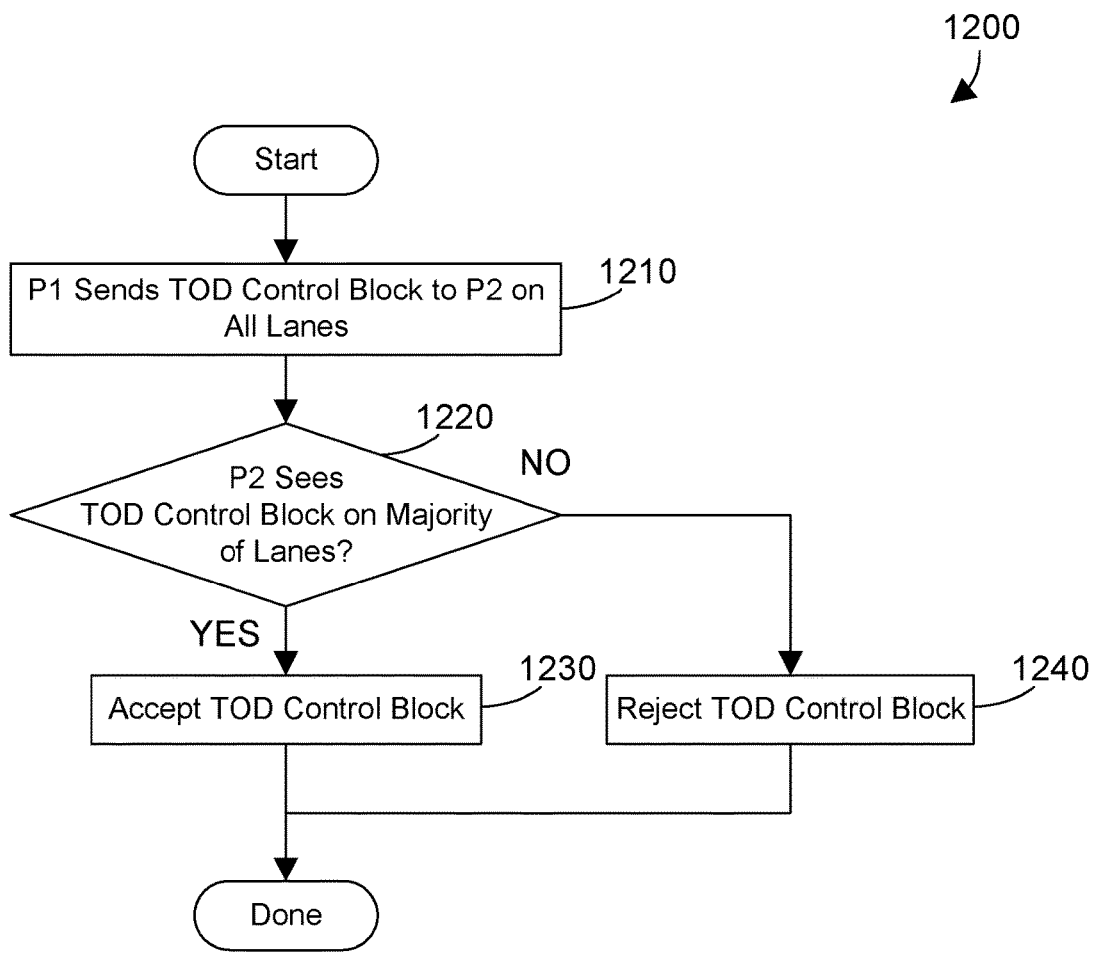
FIG. 12 is a flow diagram of a method for optical links between processors to process TOD packets.

Referring to FIG. 12, a method 1200 shows how to process TOD control blocks. Method 1200 could apply, for example, to the optical links in the communication fabric 130. P1 sends a TOD control block to P2 on all lanes (step 1210). Assuming the optical links have ten lanes, this means the TOD control block is sent by P1 to P2 on all ten lanes. When P2 sees the TOD control block on a majority of the lanes (step 1220=YES), the TOD control block is accepted and processed (step 1230). When P2 does not see the TOD control block on the majority of the lanes (step 1220=NO), the TOD control block is rejected (step 1240). Method 1200 is then done.

A time of day (TOD) synchronization mechanism in a first processor transmits a latency measure message simultaneously on two links to a second processor. In response, the receiver in the second processor detects latency differential between the two links, detects the delay in the second processor, and sends the latency differential and delay to the first processor on one of the two links. The first processor stores TOD delay values in the two links that account for the latency differential between the two links. When a TOD message needs to be sent, a link loads a counter with its stored TOD delay value, then decrements the counter until the TOD message is ready to be sent. The resulting counter value is the receiver delay value, which is transmitted to the receiver as data in the TOD message. Because the link delay values account for the latency differential between the two links, the TOD jitter between the two links is reduced.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:

1. A processor that executes instructions, the processor comprising:
   a first communication link that comprises a first transmitter, a first receiver, and a first time of day (TOD) delay register;
   a second communication link that comprises a second transmitter, a second receiver, and a second TOD delay register; and
   a TOD synchronization mechanism that sends a latency measure message at the same time on the first and second communication links to a second processor, and receives a response from the second processor on one of the first and second communication links, wherein the response comprises differential latency between the first and second communication links as detected by the second processor and delay in processing the latency measure message in the second processor, wherein the TOD synchronization mechanism stores values in the first TOD delay register and the second TOD delay register that are different by the differential latency between the first and second communication links, and when a first TOD message needs to be sent on the first communication link, the TOD synchronization mechanism loads a first counter with a first value read from the first TOD delay register, decrements the first counter until the first TOD message is ready to be sent, and includes a value of the first counter as a first receiver delay value in the first TOD message, and when a second TOD message needs to be sent on the second communication link, the TOD synchronization mechanism loads a second counter with a second value read from the second TOD delay register, decrements the second counter until the second TOD message is ready to be sent, and includes a value of the second counter as a second receiver delay value in the second TOD message.

2. The processor of claim 1 wherein, when the latency in the first communication link is longer than the latency in the second communication link, a first value is stored in the first TOD delay register, and the first value plus the differential latency is stored in the second TOD delay register.

3. The processor of claim 1 wherein the first receiver delay value and the second receiver delay value are the same.

4. The processor of claim 1 wherein the first and second communication links are connected to a communication fabric that connects the first and second communication links in the first processor with corresponding third and fourth communication links in the second processor, wherein the third communication link comprises a third transmitter and a third receiver in the second processor and the fourth communication link comprises a fourth transmitter and a fourth receiver in the second processor.

5. The processor of claim 1 wherein the first and second communication links are electrical links on the first processor that apply error correction codes when an error is detected in the response.

6. The processor of claim 5 wherein the first and second communication links perform a cyclic redundancy check (CRC) of the response.

7. The processor of claim 6 wherein when the CRC of a received TOD packet is correct, the first processor accepts and processes the received TOD packet.

8. The processor of claim 1 wherein the first and second communication links are optical links on the first processor, wherein the first TOD message received by the second processor from the first processor is sent on all of a plurality of lanes, and when the second processor sees the first TOD message on a majority of the plurality of lanes, the first TOD message is accepted and processed by the second processor.

9. The processor of claim 8 wherein, when the second processor does not see the first TOD message on the majority of the plurality of lanes, the first TOD message is rejected and not processed by the second processor.

10. A method of communicating between a first processor and a second processor, the method comprising:
    providing a first processor comprising:
        a first communication link that comprises a first transmitter, a first receiver, and a first time of day (TOD) delay register;
        a second communication link that comprises a second transmitter, a second receiver and a second TOD delay register;
    providing a communication fabric that connects the first and second communication links in the first processor with corresponding third and fourth communication links in the second processor, wherein the third communication link comprises a third transmitter and a third receiver in the second processor and the fourth communication link comprises a fourth transmitter and a fourth receiver in the second processor;
    sending by the first processor a latency measure message at the same time on the first and second communication links to the second processor;
    the first processor receiving a response from the second processor on one of the first and second communication links, wherein the response comprises differential latency between the first and second communication links as detected by the second processor and delay in processing the latency measure message in the second processor;
    storing values in the first TOD delay register and the second TOD delay register that are different by the differential latency between the first and second communication links;
    when a first TOD message needs to be sent on the first communication link:
        loading a first counter with a first value read from the first TOD delay register;
        decrementing the first counter until the first TOD message is ready to be sent; and
        including a value of the first counter as a first receiver delay value in the first TOD message;
    when a second TOD message needs to be sent on the second communication link:
        loading a second counter with a second value read from the second TOD delay register;
        decrementing the second counter until the second TOD message is ready to be sent; and
        including a value of the second counter as a second receiver delay value in the second TOD message.

11. The method of claim 10 wherein, when the latency in the first communication link is longer than the latency in the second communication link, storing a first value as the first TOD delay value, and storing the first value plus the differential latency as the second TOD delay value.

12. The method of claim 10 wherein the first receiver delay value and the second receiver delay value are the same.

13. The method of claim 10 wherein the first and second communication links are electrical links on the first processor, wherein the method further comprises applying error correction codes when an error is detected in the response.

14. The method of claim 13 wherein the first and second communication links perform a cyclic redundancy check (CRC) of the response.

15. The method of claim 14 wherein when the CRC of a received TOD packet is correct, the first processor accepts and processes the received TOD packet.

16. The method of claim 10 wherein the first and second communication links are optical links on the first processor, wherein the method further comprises the first processor sending to the second processor the first TOD message on all of a plurality of lanes, and when the second processor sees the first TOD message on a majority of the plurality of lanes, the second processor accepting and processing the first TOD message.

17. The method of claim 16 wherein, when the second processor does not see the second TOD message on the majority of the plurality of lanes, the second processor rejecting and not processing the first TOD message.

18. A method of communicating between a first processor and a second processor, the method comprising:
    providing a first processor comprising:
        a first communication link that comprises a first transmitter, a first receiver, and a first time of day (TOD) delay register, wherein the first communication link comprises a first optical link that defines a first plurality of lanes;
        a second communication link that comprises a second transmitter, a second receiver, and a second TOD delay register, wherein the second communication link comprises an optical link that defines a second plurality of lanes;
    providing a communication fabric that connects the first and second communication links in the first processor with corresponding third and fourth communication links in the second processor, wherein the third communication link comprises a third transmitter and a third receiver in the second processor and the fourth communication link comprises a fourth transmitter and a fourth receiver in the second processor;

sending by the first processor a latency measure message at the same time on the first and second communication links to the second processor;

the second processor receiving the latency measure message, and in response, determining a differential latency between the first and second communication links as seen by the second processor and a delay in processing the latency measure message in the second processor, and sending a first response;

the first processor receiving the first response from the second processor on one of the first and second communication links;

the first processor storing values in the first TOD delay register and the second TOD delay register that are different by the differential latency between the first and second communication links;

when a first TOD message needs to be sent on the first communication link:
  loading a first counter with a first value read from the first TOD delay register;
  decrementing the first counter until the first TOD message is ready to be sent; and
  including a value of the first counter as a first receiver delay value in the first TOD message;

when a second TOD message needs to be sent on the second communication link:
  loading a second counter with a second value read from the second TOD delay register;
  decrementing the second counter until the second TOD message is ready to be sent; and
  including a value of the second counter as a second receiver delay value in the second TOD message;

the first transmitter in the first processor sending the first TOD message on all of the first plurality of lanes, and when the first receiver in the second processor sees the first TOD message on a majority of the first plurality of lanes, the second processor accepting and processing the first TOD message, and when the second processor does not see the first TOD message on the majority of the first plurality of lanes, the second processor rejecting and not processing the first TOD message;

the second transmitter in the first processor sending the second TOD message on all of the second plurality of lanes, and when the second receiver in the second processor sees the first TOD message on a majority of the first plurality of lanes, the second processor accepting and processing the second TOD message, and when the second processor does not see the second TOD message on the majority of the second plurality of lanes, the second processor rejecting and not processing the second TOD message.

* * * * *